(12) United States Patent
Fuma et al.

(10) Patent No.: US 11,834,283 B2
(45) Date of Patent: Dec. 5, 2023

(54) LOADING SYSTEM

(71) Applicants: Daifuku Co., Ltd., Osaka (JP); Iwasaki Seisakusho Co., Ltd., Tokyo (JP)

(72) Inventors: Takafumi Fuma, Komaki (JP); Yoshitaka Deguchi, Hinocho (JP); Motoi Harada, Hinocho (JP); Keishi Shibata, Hinocho (JP); Hiroshi Ishiguro, Tokyo (JP)

(73) Assignees: Daifuku Co., Ltd., Osaka (JP); Iwasaki Seisakusho Co., Ltd., Tokyo (JP)

(*) Notice: Subject to any disclaimer, the term of this patent is extended or adjusted under 35 U.S.C. 154(b) by 973 days.

(21) Appl. No.: 16/597,239

(22) Filed: Oct. 9, 2019

(65) Prior Publication Data
US 2020/0115173 A1 Apr. 16, 2020

(30) Foreign Application Priority Data
Oct. 12, 2018 (JP) .................. 2018-193503

(51) Int. Cl.
*B65G 65/00* (2006.01)
*B65G 69/00* (2006.01)
(Continued)

(52) U.S. Cl.
CPC .......... *B65G 65/005* (2013.01); *B65G 65/32* (2013.01); *B65G 69/003* (2013.01);
(Continued)

(58) Field of Classification Search
CPC . B65G 65/005; B65G 65/32; H01L 21/67259; H01L 21/6734
See application file for complete search history.

(56) References Cited

U.S. PATENT DOCUMENTS

| 6,542,839 B1 * | 4/2003 | Lu ...................... H01L 21/67259 250/559.38 |
| 2003/0060922 A1 * | 3/2003 | Schauer .................. H01L 21/68 700/213 |
| 2016/0260629 A1 * | 9/2016 | He ........................ H01L 21/681 |

FOREIGN PATENT DOCUMENTS

| JP | 8217207 A | 8/1996 |
| JP | 200479615 A | 3/2004 |
| JP | 2006273521 A | 10/2006 |

* cited by examiner

*Primary Examiner* — Saul Rodriguez
*Assistant Examiner* — Willie W Berry, Jr.
(74) *Attorney, Agent, or Firm* — THE WEBB LAW FIRM

(57) ABSTRACT

A loading system includes one or more adjusting mechanisms configured to adjust a position of the container held by the container holder, a controller configured to control operation of the one or more adjusting mechanisms, a transfer mechanism configured to move a loadable object into a holding space of the container with the container held by the container holder to transfer the loadable object to the container, and one or more position detectors. The one or more position detectors are located to detect a relative position of a loadable object when the loadable object is held by the transfer mechanism and is in the holding space. The controller is configured to perform an adjusting control in which the position of the container is adjusted to place the container in a proper position with respect to the loadable object, the adjusting control being performed based on detected information from the one or more position detectors, and being performed during at least a portion of a process of transferring the loadable object by the transfer mechanism, and being completed before the loadable object becomes supported by the container.

2 Claims, 6 Drawing Sheets

(51) Int. Cl.
*B65G 65/32* (2006.01)
*H01L 21/67* (2006.01)
*H01L 21/673* (2006.01)

(52) U.S. Cl.
CPC ........ *B65G 69/006* (2013.01); *H01L 21/6734* (2013.01); *H01L 21/67259* (2013.01)

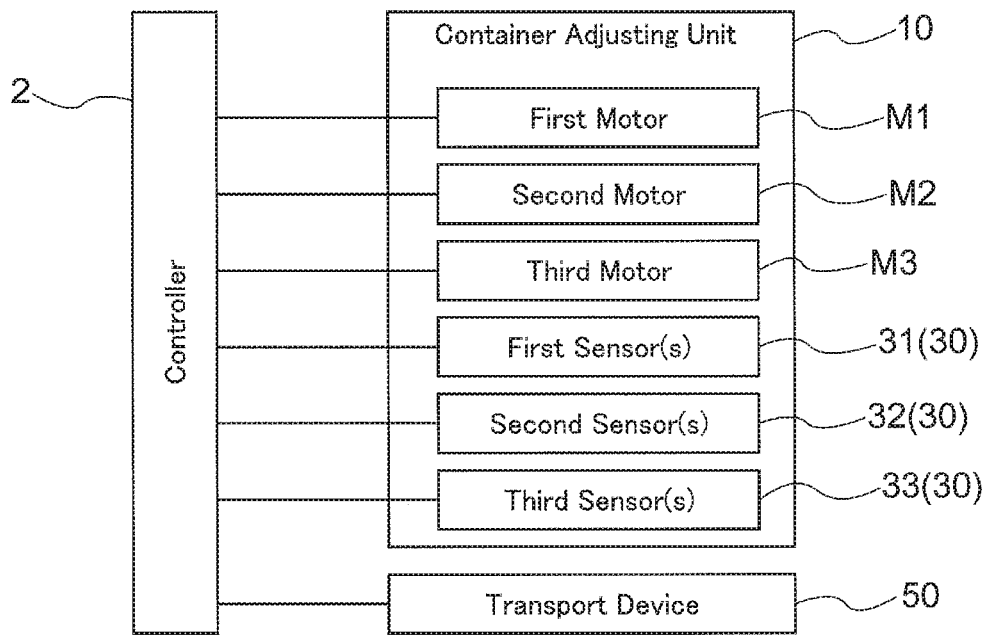
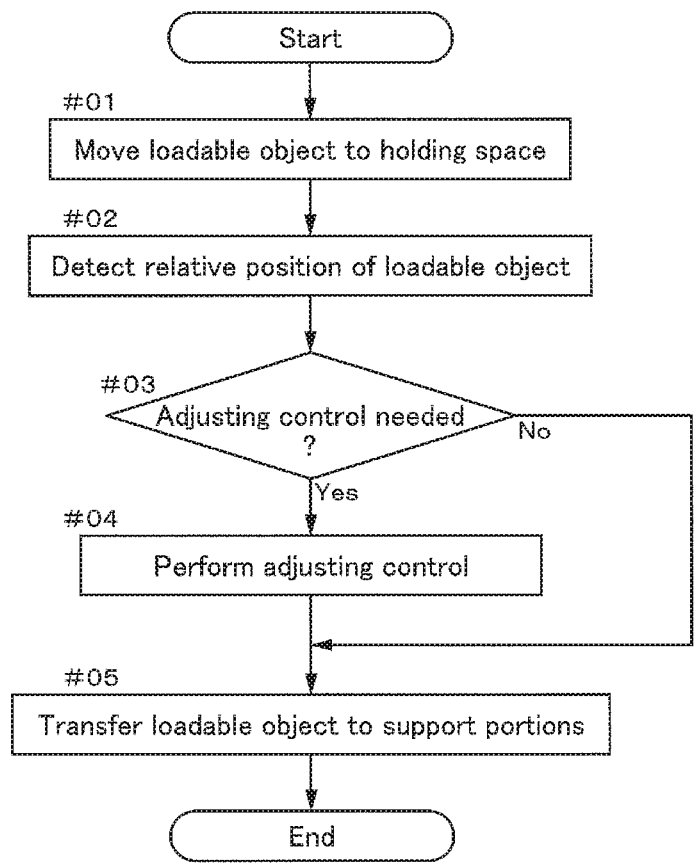

LOADING SYSTEM

CROSS-REFERENCE TO RELATED APPLICATION

This application claims priority to Japanese Patent Application No. 2018-193503 filed Oct. 12, 2018, the disclosure of which is hereby incorporated by reference in its entirety.

FIELD OF THE INVENTION

The present invention relates to a loading system configured to load one or more loadable objects into a container.

BACKGROUND ART

In manufacturing facilities for manufacturing various kinds of industrial products, such as facilities for manufacturing semiconductor products, containers for holding objects are used to hold articles (for example, semiconductor wafers, and glass substrates, etc.) to be processed or articles (for example, reticles, and masks, etc.) to be used to process other articles. An example of such a container is disclosed in JP Publication of Application No. H08-217207 (Patent Document 1). In the following description of the background art, the reference numerals and symbols in brackets are those used in Patent Document 1. In Patent Document 1, the support frame (19) functions as a container and workpieces (W) are the objects being placed in the container. Patent Document 1 discloses technology for centering the workpieces (W) that are temporarily placed in the support frame (19). As described in Paragraph 0005 of Patent Document 1, the workpieces (W) are centered to prevent such problems as a workpiece (W) failing to be transferred to the next step and a workpiece (W) coming into contact with the support frame (19) when retrieving them from the support frame (19).

As described above, the technology described in Patent Document 1 is used to center the workpieces (W) temporarily placed in the support frame (19). In the technology described in Patent Document 1, a workpiece (W) (supported by support pieces (23, 25) of the support frame (19)) is raised by a hand member (36) inserted into a space below the workpiece (W) in order to allow the centering to be performed smoothly, and thereafter the support frame (19) is moved such that the centerline (C1) of the workpiece (W) and the centerline (C2) between the right and left support pieces (23, 25) coincide with each other. Subsequently, the workpiece (W) is unloaded from the hand member (36) onto the support pieces (23, 25).

SUMMARY OF THE INVENTION

As described above, with the technology described in Patent Document 1, the centering operations are performed on the objects that are temporarily placed in the container. Therefore, in addition to the steps for temporarily placing objects in a container in advance, a step for interrupting the supporting of a placed object by the container and a step for causing the object to be supported again by the container are required in a centering operation. For this reason, with the technology described in Patent Document 1, a large number of steps are required to place the objects in a container in respective proper positions in the container, which may lower the operating efficiency of the facility.

Therefore, a loading system is desired which is capable of reducing the number of steps required to place an object in a proper position in a container.

A loading system in accordance with the present disclosure and configured to load a loadable object into a container comprises: a container holder configured to hold a container; one or more adjusting mechanisms configured to adjust a position of the container held by the container holder; a controller configured to control operation of the one or more adjusting mechanisms; a transfer mechanism configured to move a loadable object into a holding space of the container with the container held by the container holder to transfer the loadable object to the container; one or more position detectors configured to detect a position of a loadable object; wherein the one or more position detectors are so located to detect a relative position of a loadable object with respect to the container when the loadable object is held by the transfer mechanism and is in the holding space, and wherein the controller is configured to perform an adjusting control in which the position of the container is adjusted to place the container in a proper position with respect to the loadable object, the adjusting control being performed based on detected information from the one or more position detectors, and being performed during at least a portion of a process of transferring the loadable object by the transfer mechanism, and being completed before the loadable object becomes supported by the container.

With such an arrangement, because the adjusting control is performed during at least a portion of a process of transferring a loadable object to a container by the transfer mechanism, the loadable object can be placed in a proper holding position in the container by adjusting the position of the container held by the container holder such that the container is in the proper position with respect to the loadable object, when transferring the loadable object to the container. In addition, this adjusting control is completed before the loadable object becomes supported by the container; therefore, the position of the container can be adjusted smoothly while the loadable object and the container are not in contact with each other.

Thus, with the arrangement described above, by performing the adjusting control during at least a portion of a process of transferring a loadable object to the container by the transfer mechanism, the loadable object can be placed in a proper holding position in the container, when transferring the loadable object to a container. Thus, the loadable object can be placed in the proper holding position in the container without the need to perform an operation to move the loadable object other than the transferring of the loadable object to the container. Thus, the number of steps required to achieve such a state can be reduced.

Note that, with the arrangement described above, the relative position of one of the loadable object held by the transfer mechanism and the container held by the container holder with respect to the other is adjusted by adjusting the position of the container held by the container holder. Thus, this loading system can be advantageously used in a case where it is difficult to finely adjust the position of a loadable object with the transfer mechanism.

Additional features and advantages of the loading system will be made apparent from the following description of the embodiments given with reference to the attached drawings.

BRIEF DESCRIPTION OF THE DRAWINGS

FIG. 6 is a block diagram showing at least some of control related parts, and FIG. 7 is a control flow chart.

DETAILED DESCRIPTION OF EMBODIMENTS

The embodiments of a loading system are described next with reference to the drawings.

Figure 1:
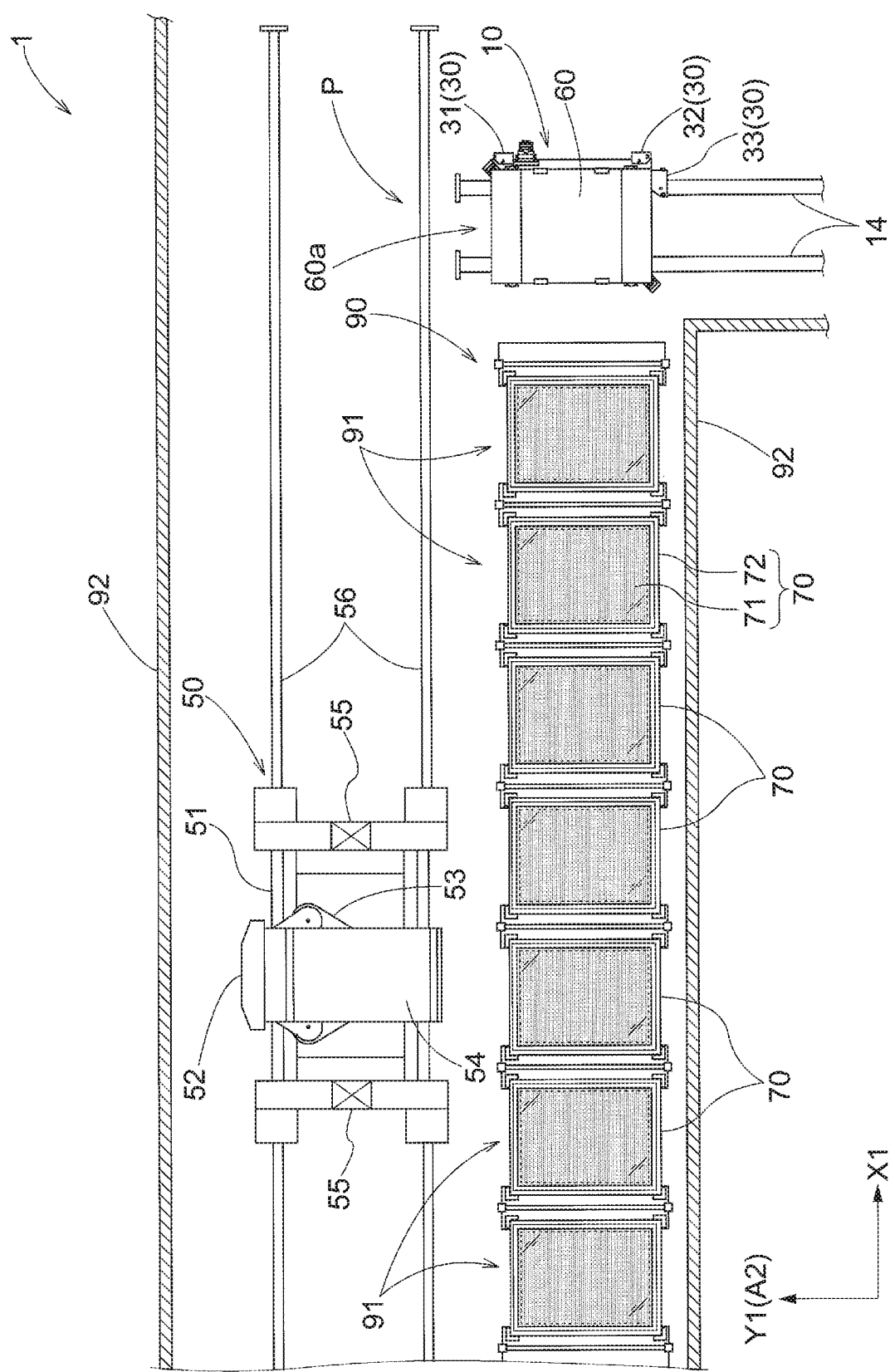
FIG. 1 is a plan view of a loading system.

The loading system 1 is a system configured to load loadable objects 70 into a container 60 (i.e., to place loadable objects 70 in a container 60). A loadable object 70 is an object that is capable of being loaded into (i.e., placed in) a container 60. In the present embodiment, each loadable object 70 is formed to be flat and thin (thickness is less than horizontal dimensions). More specifically, as shown in FIG. 1, each loadable object 70 is a mask (for example, a vapor deposition mask), and consists of a mask body 71 and a mask frame 72 which supports the mask body 71. The masks, as the loadable objects 70, are used, for example, in manufacturing organic EL (Electro-Luminescence) displays, In this case, the loading system 1 is provided in a production line for organic EL displays.

As shown in FIGS. 1-3, and 6, the loading system 1 includes a container holder 13 configured to hold (i.e., support) a container 60, adjusting mechanisms 20 configured to adjust the position of the container 60 held by the container holder 13, a controller 2 configured to control the operations of the adjusting mechanisms 20, a transfer mechanism 53 configured to transfer loadable objects 70, one object at a time, to the container 60, and position detectors 30 configured to detect the position of a loadable object 70. The transfer mechanism 53 moves the loadable objects 70, one object at a time, to the holding space 62 of the container 60 with the container held by the container holder 13 to transfer the loadable objects 70 to the container 60. In the present example, the transfer mechanism 53 is also configured to be capable of retrieving the loadable objects 70, one at a time, from a container 60. In other words, the transfer mechanism 53 is capable of moving the loadable objects 70 (that are in the container 60 held by the container holder 13) out of the holding space 62 to retrieve the loadable objects 70, one at a time, from the container 60.

Figure 2:
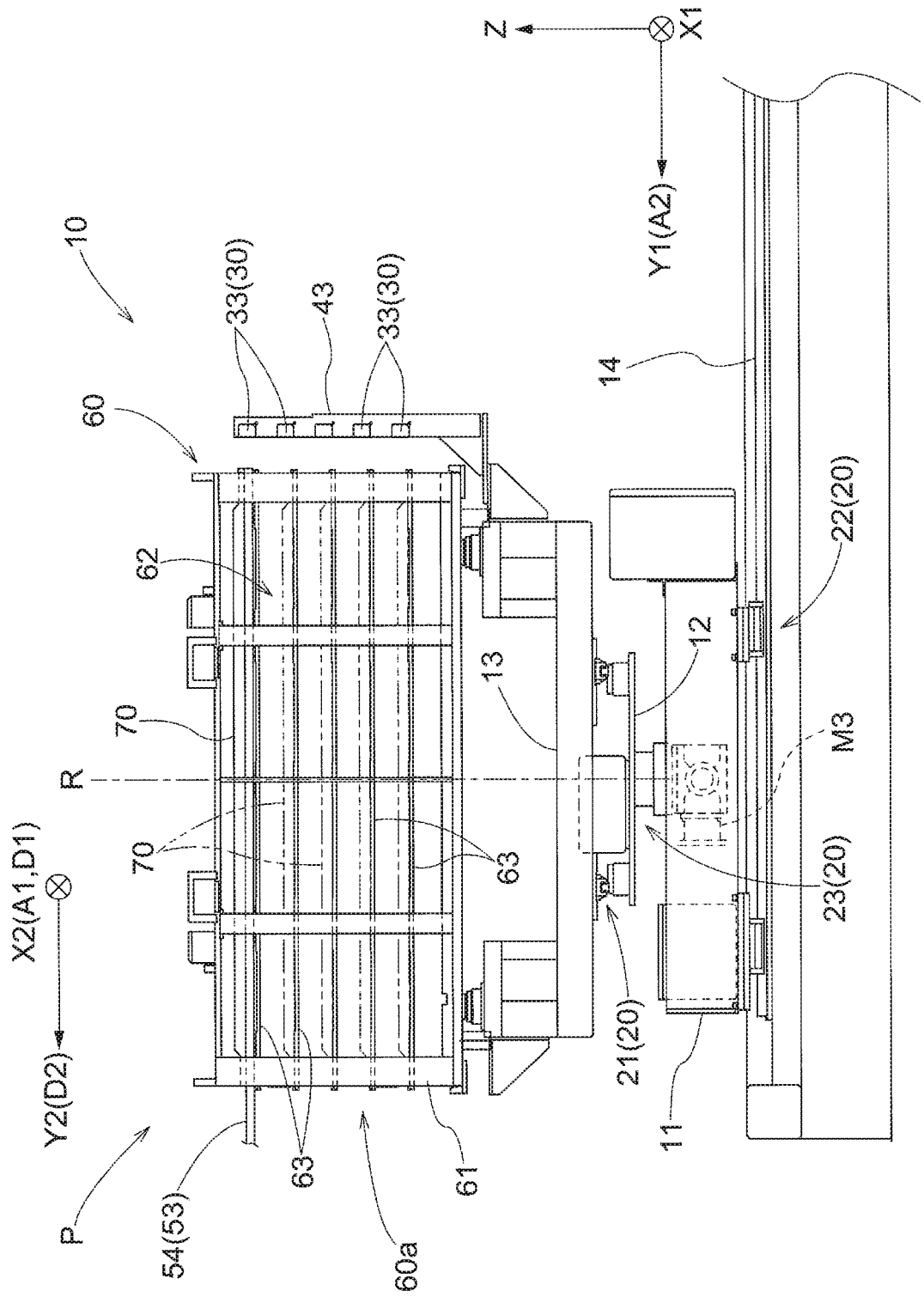
FIG. 2 is a side view of a container adjusting unit.
Figure 3:
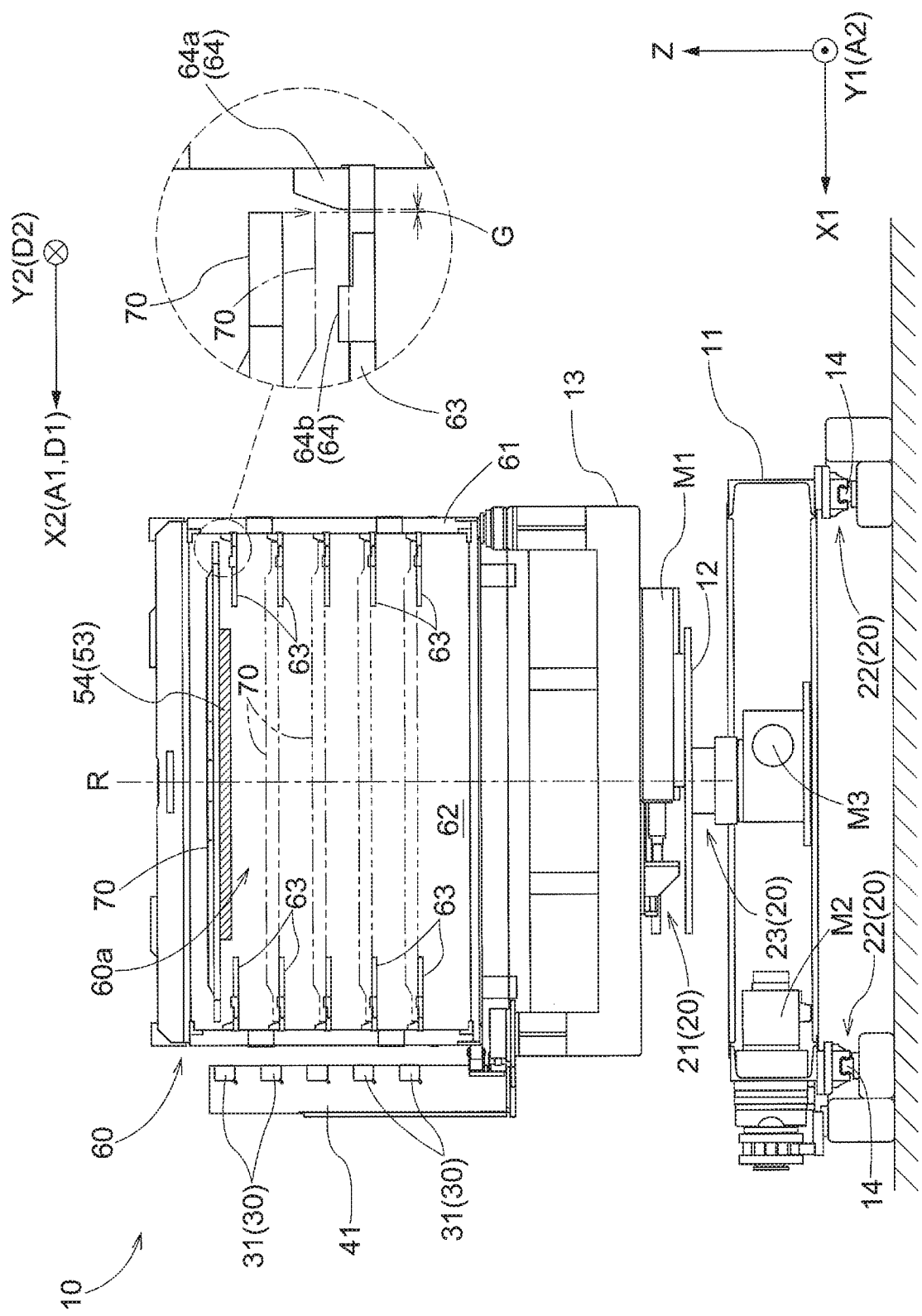
FIG. 3 is a front view of the container adjusting unit.

As shown in FIGS. 2 and 3, the container holder 13, the adjusting mechanisms 20, and the position detectors 30 form a container adjusting unit 10 configured to adjust the position of a container 60. In the present embodiment, the container adjusting unit 10 is configured to be capable of traveling (i.e., movable) with the container 60 held or supported thereby. That is, the container adjusting unit 10 is a unit capable of moving. In the present example, as shown in FIG. 1, the container adjusting unit 10 is configured to be capable of traveling along first rails 14. The container adjusting unit 10 moves a container 60 (for example, an empty container 60 with no loadable objects 70 held therein), that is designated to hold loadable objects 70, to a transfer location P (see FIG. 1) at which the transfer mechanism 53 transfers loadable objects 70 to the container 60. In addition, the container adjusting unit 10 moves the container 60 with the loadable objects 70 held therein from the transfer location P. For example, the container adjusting unit 10 moves the container 60 being moved out of the transfer location P to a location at which the container 60 is transferred between the container adjusting unit 10 and another transport device (not shown).

In the description below, the first direction X1 and the second direction Y1 (see FIG. 1) are two horizontal directions that are perpendicular to each other. In contrast to the third direction X2 and the fourth direction Y2 (see FIG. 4) described below, the first direction X1 and second directions Y1 are defined as directions that are fixed in the space in which the loading system 1 is provided. As shown in FIG. 2, the transfer mechanism 53 transfers loadable objects 70 to the container 60 from the the second direction Y1 side with respect to the container 60, at the transfer location P. Here, and in the description below, the expression "transfer location P" is also used to indicate the location of the transfer mechanism 53 when transferring the loadable objects 70 to or from a container 60. In other words, the second direction Y1 is defined as a direction along (i.e., parallel to) the direction along which the transfer mechanism 53 at its transfer location P and the container 60 at its transfer location P are lined up with, and spaced apart from, each other, in plan view (as seen along a vertical direction Z). In the present embodiment, as shown in FIGS. 1-3, the transfer mechanism 53 has a support member 54 configured to support a loadable object 70 from below. As shown in FIG. 3, the support member 54 supports the center portion, along the first direction X1, of a loadable object 70. The transfer mechanism 53 is configured to be capable of projecting and retracting the support member 54 in the direction along the second direction Y1 (i.e., capable of projecting the support member 54 toward the container 60 and retracting the support member 54 away from the container 60). And a loadable object 70 is transferred between the transfer mechanism 53 and the container 60 with the support member 54 in the projected position or state.

As shown in FIG. 2 and FIG. 3, the container 60 has a container main body 61 that surrounds the holding space 62 for the loadable objects 70. The container main body 61 has an opening 60a for allowing loadable objects 70 to be moved into and out of the holding space 62. In the present example, the container main body 61 is formed in a rectangular parallelepiped shape which has four side walls And the opening 60a is formed in one of the side walls. In the present example, as shown in FIG. 2, openings for allowing inside and outside of the holding space 62 to communicate are formed in the side walls that are not the side wall in which the opening 60a is formed. And at the transfer location P, the container 60 is held by the container adjusting unit 10 (more specifically, by the container holder 13) with the container 60 in an orientation (orientation shown in FIG. 1-FIG. 3) in which the opening 60a faces the side the transfer mechanism 53 is located (faces in the second direction Y1).

Figure 4:
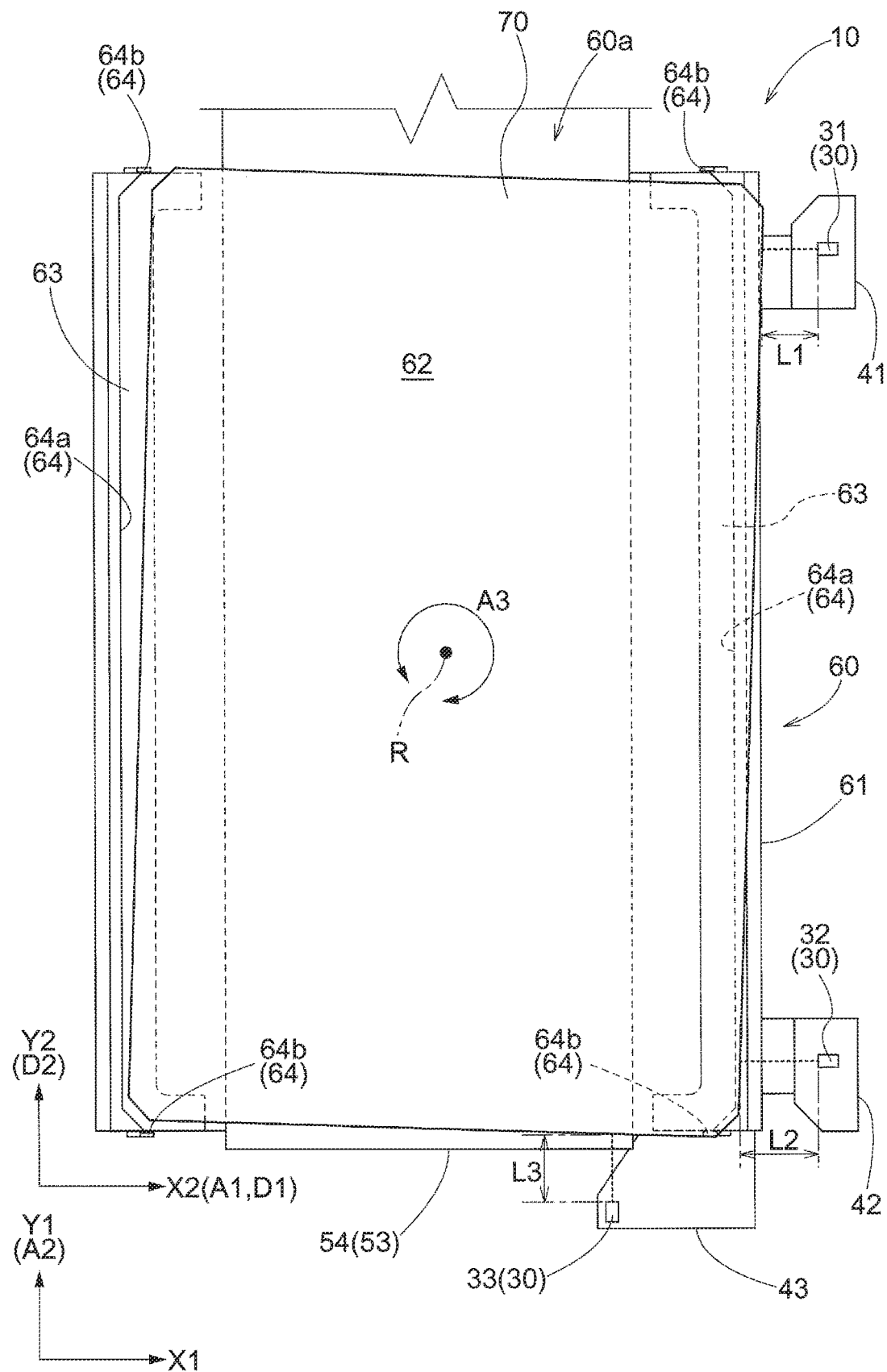
FIG. 4 shows an example of states of various parts before an adjusting control is performed.

In the description below, the third direction X2 and the fourth direction Y2 (see FIG. 4) are two horizontal directions that are perpendicular to each other. The third direction X2 and fourth direction Y2 are defined with respect to the container holder 13 (see FIGS. 2 and 3) provided to the container adjusting unit 10. And the third direction X2 and the fourth direction Y2 are so defined that, as the container holder 13 is rotated about a rotation axis R described below, the third direction X2 and the fourth direction Y2 also rotate while maintaining the perpendicular relationship between the two directions. As shown in FIG. 4, the container 60 is held by the container adjusting unit 10 (more specifically, by the container holder 13) with the container 60 in such an orientation that the opening 60a faces in the fourth direction Y2. In other words, the fourth direction Y2 is defined as a direction that is parallel to the direction in which the opening 60*a* (of the container 40 held by the holder 13) faces, i.e., the direction that is perpendicular to the side wall in which the opening 60*a* is formed. Because the container 60 is held and positioned in place by the container holder 13, the location and orientation of the container 60 changes with any changes in the location and the orientation of the container holder 13. In the description below, in the absence of an explicit statement to the contrary, each direction associated with a container 60 is the direction as it is defined when the container 60 is held by the container holder 13.

In the description below, the state in which the container holder 13 is so positioned and oriented that the third direction X2 is parallel to the first direction X1, i.e., is so positioned (i.e., located and oriented) that the fourth direction Y2 is parallel to the second direction Y1, the container holder 13 will be said to be in the "reference state". FIG. 2 and FIG. 3 show the container holder 13 is so positioned to be in the reference state. Loading of loadable objects 70 into the container 60 is initiated with the container holder 13 in the reference state.

As shown in FIGS. 2 and 3, the container 60 has support portions 63 configured to support loadable objects 70 from below. The support portions 63 are fixed to the container main body 61 so as to be located in the holding space 62. As shown in FIG. 4, in the present embodiment, the container 60 has pairs of support portion 63 with one support portion 63 of each pair spaced apart from the other of the pair in the third direction X2. And each loadable object 70 is supported by one corresponding pair of the support portions 63 with the support portions 63 of the pair supporting the loadable object 70 on respective sides along the third direction X2. And a loadable object 70 is transferred between the transfer mechanism 53 (more specifically, the support member 54) and the container 60 (more specifically, a pair of support portions 63) by causing at least one of the support member 54 and the container 60 to be moved along the vertical direction Z such that the support member 54 provided to the transfer mechanism 53 passes through a gap between a pair of support portions 63 along the vertical direction Z.

As shown in FIG. 4, in the present embodiment, the support portions 63 of each pair are two separate members; however, the support portions 63 of a pair may be two portions of the same member. The container 60 may have members, each generally formed in a U-shape that opens toward the opening 60*a* (i.e., a U-shape that has the bottom portion of the "U" located away from the opening 60*a*) in plan or top-down view. And each pair of support portions 63 may be formed by the two portions of a U-shaped member that are located horizontally opposite.

As described above, each loadable object 70 is formed to be flat and thin (thickness is less than horizontal dimensions) in the present embodiment. And the container 60 is so configured to hold loadable objects 70 such that loadable objects 70 are parallel to a reference plane (which may be an imaginary plane). In the present embodiment, the reference plane is a horizontal plane, and the support portions 63 are fixed to the container main body 61 such that the upward-facing support surface of each support portion 63 is parallel to the horizontal plane. In addition, the support portions 63 of each pair are fixed to the container main body 61 at the same height (vertical location), with different pairs located at different heights. This allows each loadable object 70 to be supported by a pair of support portions 63 such that the loadable object 70 extends parallel to the reference plane (i.e., the horizontal plane in the present example). In the present embodiment, as shown in FIGS. 2 and 3, the container 60 is configured to be capable of holding a plurality of loadable objects 70 (five loadable objects 70 in the present example) with one spaced from another along the vertical direction Z. That is, the container 60 has one or more support portions 63 (a pair of support portions 63 in the present example) at each of a plurality of holding locations arranged one above another along the vertical direction Z.

As shown in FIG. 3, each support portion 63 has restricting portions 64 configured to restrict horizontal movement of a loadable object 70 with each restricting portion 64 located to a side of the loadable object 70 (loadable object 70 shown with long-dashed double short-dashed lines in FIG. 3) that is at least partially supported by the support portion 63. In the present embodiment, each support portion 63 has two kinds of restricting portions 64, namely, a first restricting portion 64*a* and second restricting portions 64*b*.

Figure 5:
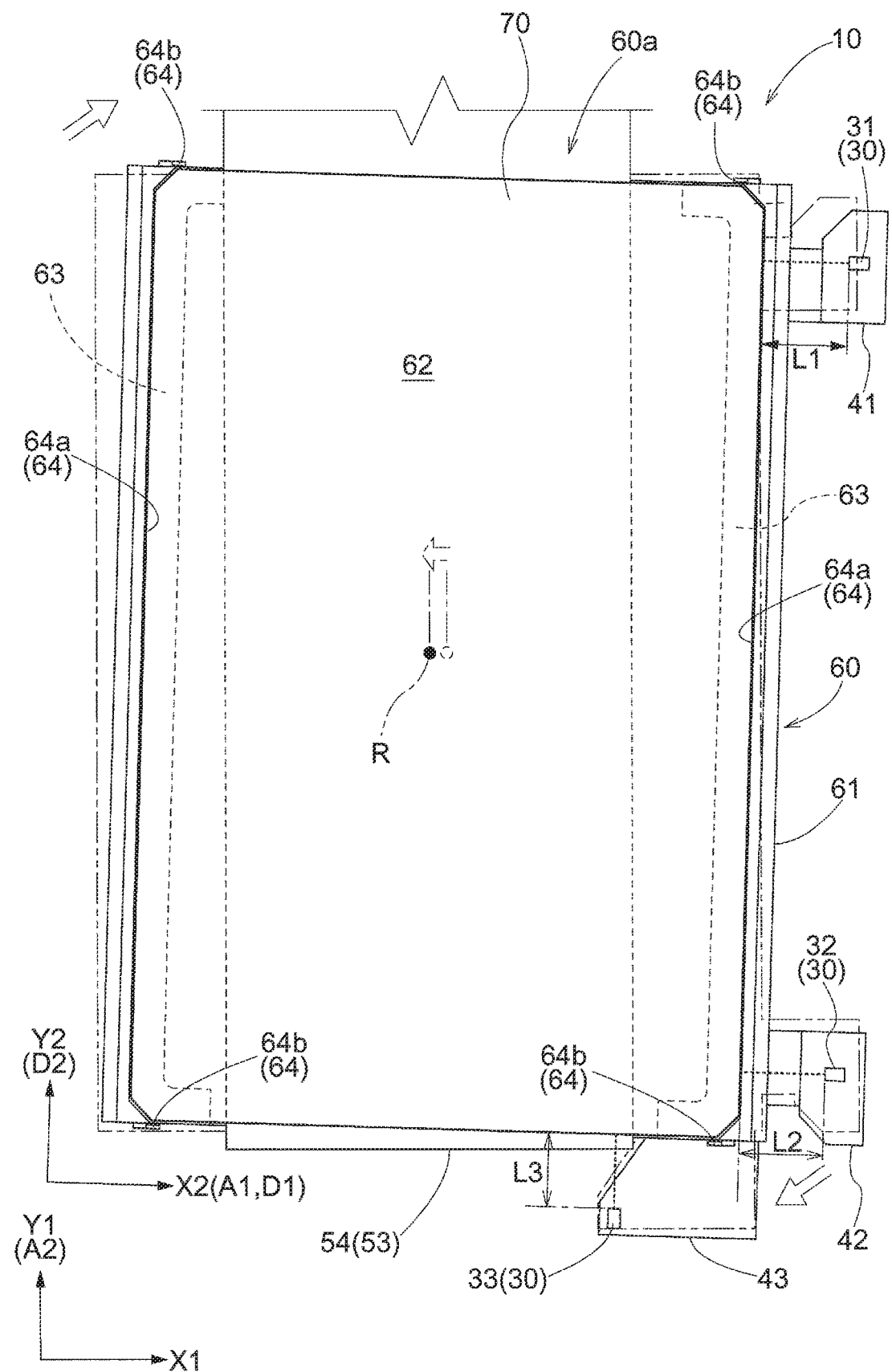
FIG. 5 shows an example of states of various parts after the adjusting control is performed.

The first restricting portion 64*a* is a restricting portion 64 configured to restrict movement of a loadable object 70 along the third direction X2. As shown in FIGS. 3 and 5, the first restricting portion 64*a* is located opposite, and so as to face, a side surface (of loadable object 70 that is at least partially supported by the support portion 63 and is shown with long-dashed double short-dashed lines in FIG. 3) that is on a side in a direction along (i.e., parallel to) the third direction X2 and located away from the center of the container 60 along the third direction X2. As such, the first restricting portion 64*a* is configured to restrict movement of the loadable object 70 in a direction along the third direction X2 and away from the center along the third direction X2. Note that FIG. 3 shows the container holder 13 being so positioned to be in the reference state described above; so, in FIG. 3, the third direction X2, is parallel to, and coincides with, the first direction X1. As shown in FIG. 5, the first restricting portion 64*a* is provided to each support portion 63 of each pair so as to restrict movement of a loadable object 70 supported by the support portions 63 in either direction along the third direction X2.

The second restricting portions 64*b* are restricting portions 64 configured to restrict movement of a loadable object 70 along the fourth direction Y2. As shown in FIGS. 3 and 5, each second restricting portion 64*b* is located opposite, and so as to face, a side surface (of loadable object 70 that is at least partially supported by the support portion 63 and is shown with long-dashed double short-dashed lines in FIG. 3) that is on a side in a direction along (i.e., parallel to) the fourth direction Y2 and located away from the center of the container 60 along the fourth direction Y2. As such, each second restricting portion 64*b* is configured to restrict movement of the loadable object 70 in a direction along the fourth direction Y2 and away from the center along the fourth direction Y2. Note that FIG. 3 shows the container holder 13 being so positioned to be in the reference state described above; so, the fourth direction Y2 is perpendicular to the paper in FIG. 3. As shown in FIG. 5, a second restricting portions 64*b* is provided in each end portion, along the fourth direction Y2, of each support portion 63 of each pair so as to restrict movement of the loadable object 70 supported by the support portions 63 in either direction along the fourth direction Y2.

In the present embodiment, the transfer mechanism 53 is configured to transfer a loadable object 70 to a pair of support portions 63 from above. More specifically, when the transfer mechanism 53 transfers a loadable object 70 (supported by the support member 54) to a pair of support portions 63, the support member 54 is projected with the support member 54 located at a set height that corresponds to the pair of support portions 63 to which the loadable object should be transferred to (or the support portions 63 that are the transfer target, or simply transfer target support portions 63) to move the support member 54 and the loadable object 70 supported by the support member 54 into the holding space 62 of the container 60 through the opening 60a. As shown in FIGS. 2 and 3, the set height is set to be such a height that the loadable object 70 supported by the support member 54 is located higher than the transfer target support portions 63 (the highest support portions 63 in the example shown in FIGS. 2 and 3). When the transfer target support portions 63 are not the highest support portions 63, the set height is set to be such a height that the loadable object 70 supported by the support member 54 is located higher than the transfer target support portions 63 and the supported loadable object 70 would not come into contact with the support portions or any loadable object 70 supported by the support portions that are located immediately above the transfer target support portions 63.

And in such a position, the loadable object 70 supported by the support member 54 is unloaded onto the support portions 63 by causing the support member 54 to approach the support portions 63 from above by causing at least one of the support member 54 and the container 60 to be moved along a vertical direction Z. The loadable object 70 is thus transferred to the support portions 63 from above. In the present embodiment, the loadable object 70 is transferred to the support portions 63 from above by causing at least one of the support member 54 and the container 60 to be moved along (i.e., parallel to) the vertical direction Z such that the support member 54 passes, or is moved, downward through a gap between, and relative to, a pair of support portions 63. And after the loadable object 70 is supported by the support portions 63, the transfer mechanism 53 retracts the support member 54 to move the support member 54 out of the holding space 62 through the opening 60a. Note that, in the present embodiment, as described below, the transfer mechanism 53 is supported by a vertically movable member 52 which is capable of moving along the vertical direction Z (i.e., is movable vertically), and that the support member 54 is caused to approach the support portions 63 from above (and to pass downward through a gap between a pair of support portions 63, in the present example) by causing the entire transfer mechanism 53 including the support member 54 to be lowered by causing the vertically movable member 52 to be lowered. Note that, the transfer mechanism 53 may include a vertically moving mechanism which vertically moves the support member 54 so that the support member 54 may be caused to approach the support portions 63 from above by causing the support member 54 to be lowered by the vertically moving mechanism.

Without going into detail, when retrieving a loadable object 70 supported by the support portions 63 from the container 60, the support member 54 is moved in the reverse order to when a loadable object 70 is transferred to the support portions 63. More specifically, the loadable object 70 to be retrieved is lifted from the support portions 63 by raising the support member 54 with respect to the container 60 after projecting the support member 54. Subsequently, the support member 54 is retracted with the loadable object 70 supported thereby. The loadable object 70 is thus retrieved through the opening 60a to the outside of the container 60 (outside of the holding space 62).

As described above, the container 60 has one or more support portions 63 (a pair of support portions 63 in the present example) at each of a plurality of holding locations arranged one above another along the vertical direction Z. And, in the present embodiment, the loadable objects 70 are transferred to the container 60 such that the loadable objects 70 are transferred, one by one, to successively lower pairs of support portions 63 (i.e., to successively lower holding location), starting from the highest pair of support portions 63 (i.e., the first loadable object 70 for the container 60 is transferred to the highest pair of support portions 63 (i.e., to the highest holding location) and the second loadable object 70 is transferred to the second highest pair of support portions 63 (second highest holding location), and so on). In addition, in the present embodiment, the loadable objects 70 are retrieved from the container 60 such that the loadable objects 70 are retrieved, one by one, from successively higher pairs of support portions 63 (i.e., from successively higher holding location), starting from the lowest pair of support portions 63 (i.e., the lowest loadable object 70 is retrieved first and the second lowest loadable object 70 is retrieved second, and so on). Therefore, in the present embodiment, the loadable objects 70 are transferred to and from the container 60 such that there would be no loadable object 70 located below the support member 54 of the transfer mechanism 53. This arrangement makes it easier to reduce the vertical spacing or distance between any two of the plurality of pairs of support portions 63 (i.e., of the plurality of holding locations) that are vertically adjacent to each other.

As shown in FIG. 1, in the present embodiment, the transfer mechanism 53 is provided to the transport device 50 configured to transport loadable objects 70, one at a time, between a storage rack 90 and the transfer location P. The storage rack 91 has a plurality of storage locations 91 each configured to store a loadable object 70. In the present example, the plurality of storage locations 91 are arranged in a plurality of vertical rows with each vertical row including a plurality of storage locations 91 arranged one adjacent another along the vertical direction Z and with the vertical rows being arranged one adjacent to another along the first direction X1. In addition, the transfer location P for the container 60 is located to a first direction X1 side of and near the storage rack 90. And the transport device 50 is configured to travel along the first direction X1 on the front side of the storage rack 90 (side on which loadable objects 70 are taken into and out of the storage rack 90) to transport the loadable objects 70, one at a time, between the storage rack 90 (more specifically the storage locations 91) and the transfer location P. In the present example, the storage rack 90 is installed in a space (space in which clean air flows from the ceiling side toward the floor side) that is surrounded by walls 92. And the transport device 50 transports the loadable objects 70 in this space.

In the present embodiment, the transport device 50 is a stacker crane. More specifically, the transport device 50 includes a travel carriage 51 capable of traveling along the first direction X1 while being guided by second rails 56 installed on the floor, and a vertically movable member 52 capable of being moved along the vertical direction Z (i.e., being capable of raised and lowered) while being guided by masts which are vertically arranged on the travel carriage 51. And the transfer mechanism 53 is supported by the vertically movable member 52. Therefore, the entire transfer mechanism 53 including the support member 54 is moved along the first direction X1 as the travel carriage 51 travels, and is moved along the vertical direction Z as the vertical movable member 52 is vertically moved or raised or lowered.

Without going into detail, each loadable object 70 is stored at a storage location 91 with the loadable object 70 supported from below by a pair of support portions for storage (or storage support portions for short) with the storage support portions of the pair being spaced apart from each other along the first direction X1. And, when retrieving a loadable object 70 stored at a storage location 91 from the storage location 91, the loadable object 70 stored at a storage location 91 is lifted by the support member 54 by raising the vertically movable member 52 after projecting the support member 54 toward the storage location 91, after which, the support member 54 is retracted away from the storage location 91. On the other hand, when storing a loadable object 70 supported by the support member 54 at the storage location 91, the loadable object 70 supported by the support member 54 is unloaded onto a pair of storage support portions by lowering the vertically movable member 52 after projecting the support member 54 toward the storage location 91, after which, the support member 54 is retracted away from the storage location 91.

When loading a loadable object 70 into a container 60, the transport device 50 retrieves the loadable object 70 (to be loaded into the container 60) from the storage rack 90 (more specifically, from a storage location 91) and moves it to transfer location P. In addition, the container adjusting unit 10 moves a container 60 (for example, an empty container 60 with no loadable objects 70 held therein), that is designated to hold loadable objects 70, to the transfer location P for the container 60. At this point in time, the container holder 13 (with the container 60 held thereon) of the container adjusting unit 10 is so positioned to be in the reference state described above. And the transport device 50 uses the transfer mechanism 53, as described above, to transfer, from above, the loadable object 70 supported by the support member 54 to a pair of support portions 63 of the container 60. More specifically, the vertically movable member 52 is vertically moved to position the support member 54 supporting the loadable object 70 at a set height that corresponds to the transfer target support portions 63. Subsequently, the loadable object 70 supported by the support member 54 is unloaded onto a pair of support portions 63 by lowering the vertically movable member 52 after projecting the support member 54 toward the container 60, after which, the support member 54 is retracted away from the storage location 91.

Each operation or action by the transport device 50 and the container adjusting unit 10 described above to load a loadable object 70 into a container 60 is performed under the control of the controller 2 (see FIG. 6). The controller 2 has one or more arithmetic processing units, such as one or more CPUs, and peripheral circuits, such as memory circuitry. And each function of the controller 2 is performed through cooperation between such hardware and one or more computer programs that are executable by hardware such as the one or more arithmetic processing units. The controller 2 does not have to be a single piece of hardware, and may be a collection of multiple pieces of hardware that are capable of communicating with one another. For example, the function of the controller 2 to control the container adjusting unit 10 may be performed by a first piece of hardware and the function of the controller 2 to control the transport device 50 may be performed by a second piece of hardware that is separate from, but is capable of communicating with, the first piece of hardware.

Incidentally, when causing a loadable object 70 to be loaded into a container 60, the controller 2 causes the support member 54 supporting the loadable object 70 to be projected by a set amount. This set amount is set depending on the difference, along the second direction Y1, between the location of the transfer mechanism 53 at its transfer position P and the location the container 60 at its transfer location P. With the support member 54 projected by the set amount, if the loadable object 70 does not overlap with the restricting portions 64 in plan view, then the loadable object 70 supported by the support member 54 can be unloaded onto a pair of support portions 63 without the loadable object 70 coming into contact with the restricting portions 64, by causing the support member 54 to approach a pair of support portions 63 from above by moving at least one of the support member 54 and the container 60 (support member 54 in the present example) along the vertical direction Z. This allows the loadable object 70 supported by the support member 54 to be loaded onto the pair of support portions 63 such that a gap G (see FIG. 3) is formed between the loadable object 70 and the restricting portions 64 on all sides of the loadable object 70 in plan view.

On the other hand, with the support member 54 projected by the set amount, if the loadable object 70 overlaps with any of the restricting portions 64 in plan view as shown in FIG. 4, then the loadable object 70 cannot be properly loaded onto a pair of support portions 63 simply by moving at least one of the support member 54 and the container 60 along the vertical direction Z. A loadable object 70 can overlap with one or more restricting portions 64 in plan view, for example, (a) if the location and/or orientation of the loadable object 70 supported by the support member 54 is displaced from the proper location and/or proper orientation with respect to the support member 54, (b) if the location of the transfer mechanism 53 at its transfer location P is displaced from the proper location, or (c) if the location of the container 60 at its transfer location P is displaced from the proper location.

Thus, the container adjusting unit 10 includes, as described above, a container holder 13 configured to hold (i.e., support) a container 60, adjusting mechanisms 20 configured to adjust the position of the container 60 held by the container holder 13, and position detectors 30 configured to detect the position of a loadable object 70. As shown in FIGS. 2-4, the position detectors 30 are so located to detect the relative position of a loadable object 70 with respect to the container 60 when the loadable object 70 is held by the transfer mechanism 53 and is in the holding space 62. In the present embodiment, the position detectors 30 are so located to detect the relative position of a loadable object 70 with respect to the container 60 when the loadable object 70 is supported by the support member 54 and the support member 54 is located at a set height described above. And the controller 2 that controls the operation of the adjusting mechanisms 20 is configured to perform an adjusting control in which the position of the container 60 is adjusted to place the container 60 in a proper position with respect to a loadable object 70. The adjusting control is performed based on detected information from the position detectors 30, and is performed during at least a portion of a process of transferring the loadable object 70 by the transfer mechanism 53, and is completed before the loadable object 70 becomes supported by the container 60. More specifically, the adjusting control is performed with the support member 54 located at the set height described above. In the present embodiment, the "process of transferring a loadable object" by the transfer mechanism 53 includes moving the loadable object 70 into the holding space 62 of the container 60, temporarily maintaining the loadable object 70 at a height above a pair of support portions 63, and lowering and transferring the loadable object 70 to the pair of support portions 63.

When transferring a loadable object 70 to the container 60, such an adjusting control is performed to allow the position of the container 60 held by the container holder 13 to be adjusted such that the container is in a proper position with respect to the loadable object 70, which, in turn, allows the loadable object 70 to be in a proper position in the container 60. (i.e., in such a position that a gap G (see FIG. 3) is formed between the loadable object 70 and the restricting portions 64 on all sides of the loadable object 70 in plan view). Note that, instead of adjusting the position of the container 60 so as to place the container 60 in a proper position with respect to the loadable object 70, it is conceivable to adjust the position of the support member 54 so as to place the loadable object 70 in a proper position with respect to the container 60. However, in such a case, one or more devices for detecting the position of the container 60 need to be provided to the support member 54, which may increase the vertical thickness (dimension along the vertical direction Z) of the support member 54. In contrast, the vertical thickness of the support member 54 can be kept small in the loading system of the present example because the position of the container 60 is adjusted so as to place the container 60 in a proper position with respect to the loadable object 70. As a result, the amount of space within the holding space 62 that is required for the sole purpose of allowing the support member 54 to move can be kept small, which allows the loading object holding efficiency of the holding space 62 to be improved.

The arrangement and structure of the container adjusting unit 10 that makes the adjusting control described above possible are described next. As described above, in the present embodiment, the container 60 is so configured to hold loadable objects 70 such that loadable objects 70 are parallel to a reference plane (horizontal plane in the present example). And we define first adjustment direction A1 and second adjustment direction A2 to be two directions that are parallel to the reference plane and perpendicular to each other. An rotation axis R is defined to be an axis extending perpendicular to the reference plane. The adjusting mechanisms 20 of the container adjusting unit 10 are (as a whole) configured to be capable of adjusting the position of the container 60 along (i.e., parallel to) each of the first adjusting direction A1, the second adjusting direction A2, and the rotational direction A3 (third adjusting direction i.e., clockwise or counterclockwise direction) about the rotation axis R. More specifically, the adjusting mechanisms 20 includes a first adjusting mechanism 21 configured to adjust the position of the container 60 along the first adjusting direction A1, a second adjusting mechanism 22 configured to adjust the position of the container 60 along the second adjusting direction A2, and a third adjusting mechanism 23 configured to adjust the position of the container 60 along the rotational direction A3 (i.e., in clockwise direction and in counterclockwise direction about the rotation axis R).

As shown in FIGS. 4 and 5, the first adjusting direction A1 coincides with the third direction X2 in the present embodiment. Thus, the first adjusting mechanism 21 is a mechanism that adjusts the position of the container 60 along the third direction X2. In the present example, the first adjusting mechanism 21 is a mechanism that moves and guides the container holder 13 along the third direction X2 with respect to a rotatable platform 12 while preventing movement of the container holder 13 along the fourth direction Y2 with respect to the rotatable platform 12. Without going into detail, as shown in FIG. 2, in the present embodiment, the first adjusting mechanism 21 includes, for example, a linear guide which includes guide rails so disposed to extend along the third direction X2 and a guide block which is guided by the guide rails and movable along the third direction X2. Note that FIG. 2 shows the container holder 13 so positioned to be in the reference state described above; so, the third direction X2 is perpendicular to the paper in FIG. 2.

The first adjusting mechanism 21 of the container adjusting unit 10 includes a first motor M1 (an electric motor in the present example) which provides the actuating force for the first adjusting mechanism 21. And the controller 2 causes the position of the container 60 to be adjusted along the first adjusting direction A1 (the third direction X2) by causing the container holder 13 to be moved along the third direction X2 with respect to the rotatable platform 12 by controlling the operation of the first motor M1. In the present embodiment, as shown in FIG. 3, the first motor M1 is an electric motor that forms a part of an electric cylinder (having one portion fixed to the rotatable platform 12 and another portion (that is movable with respect to said one portion) fixed to the container holder 13) for example; so, the first adjusting mechanism 21 includes this electric cylinder.

As shown in FIGS. 1 and 2, in the present embodiment, the second adjusting direction A2 coincides with the second direction Y1. Thus, the second adjusting mechanism 22 is a mechanism that adjusts the position of the container 60 along the second direction Y1. As described above, the container adjusting unit 10 is a movable unit in the present embodiment and the container adjusting unit 10 is so configured that the entire container adjusting unit is capable of traveling along the first rails 14 disposed to extending along the second direction Y1. More specifically, in the present embodiment, as shown in FIGS. 2 and 3, the container adjusting unit 10 has a main body 11 that is guided by the first rails 14 and capable of traveling along the second direction Y1. And the second adjusting mechanism 22 is a mechanism that moves and guides the main body 11 along the second direction Y1. That is, in the present embodiment, the mechanism that moves the entire container adjusting unit 10 along the second direction Y1 is used also as the second adjusting mechanism 22. As shown in FIG. 3, in the present embodiment, the second adjusting mechanism 22 includes, for example, a linear guide which includes the first rails 14, and a guide block which is guided by the first rails 14 and movable along the second direction Y1.

The second adjusting mechanism 22 of the container adjusting unit 10 includes a second motor M2 (an electric motor in the present example) which provides the actuating force for the second adjusting mechanism 22. And the controller 2 causes the position of the container 60 to be adjusted along the second adjusting direction A2 (the second direction Y1) by causing the main body 11 to be moved along the second direction Y1 (i.e., by causing the entire container adjusting unit 10 to be moved along the second direction Y1) by controlling the operation of the second motor M2. In the present embodiment, as shown in FIG. 3, the second motor M2 is so configured, for example, to rotate a pinion gear that meshes with a rack provided along one of the first rails 14.

The third adjusting mechanism 23 is a mechanism that adjusts the position of the container 60 along the rotational direction A3 (i.e., in clockwise direction and in counterclockwise direction about the rotation axis R). In the present embodiment, as shown in FIGS. 2 and 3, the third adjusting mechanism 23 is a mechanism that rotates the rotatable platform 12 about the rotation axis R with respect to the main body 11. In the present embodiment, as described above, the first adjusting mechanism 21 is configured to move the container holder 13 with respect to the rotatable platform 12; therefore, the angle (in a plane parallel to the reference plane (the horizontal plane in the present example)) between (a) the first adjusting direction A1 which is the direction along which the position of the container 60 is adjusted by the first adjusting mechanism 21, and (b) the second adjusting direction A2 which is the direction along which the position of the container 60 is adjusted by the second adjusting mechanism 22 changes depending on the rotational position (angular position) of the rotatable platform 12. That is, with a reference rotational position being defined to be the rotational position of the rotatable platform 12 at which the container holder 13 is in the reference state, the angle between the first adjusting direction A1 and the second adjusting direction A2 depends on the difference between the rotational position of the rotatable platform 12 and the reference rotational position. As shown in FIG. 4, when the rotatable platform 12 is at the reference rotational position (i.e., the rotational position of the rotatable platform 12 coincides with the reference rotational position), the angle between the first adjusting direction A1 and the second adjusting direction A2 is 90 degrees.

The third adjusting mechanism 23 of the container adjusting unit 10 includes a third motor M3 (an electric motor in the present example) which provides the actuating force for the third adjusting mechanism 23. And the controller 2 causes the position of the container 60 to be adjusted along the rotational direction A3 (i.e., in clockwise direction and in counterclockwise direction about the rotation axis R) by causing the rotatable platform 12 to be rotated about the rotational axis R with respect to the main body 11 by controlling the operation of the third motor M3.

In the present embodiment, because each of the adjusting mechanisms 20 (the first adjusting mechanism 21, the second adjusting mechanism 22, and the third adjusting mechanism 23) has a corresponding structure described above, the position of the container 60 is adjusted to the proper position with respect to the loadable object 70 (being transferred) in the adjusting control as a result of the adjusting mechanisms 20 adjusting the position of the main body 11 along the second direction Y1 (i.e., the second adjusting direction A2), the rotational position (position along the rotational direction A3) of the rotatable platform 12 about the rotation axis R with respect to the main body 11, and the position of the container holder 13 along the third direction X2 (i.e., the first adjusting direction A1) with respect to the rotatable platform 12. As described below, the controller 2 is configured to derive, based on the detected information from the position detectors 30: (a) the amount by which the position of the container 60 needs to be adjusted along the first adjusting direction A1; (b) the amount by which the position of the container 60 needs to be adjusted along the second adjusting direction A2, and (c) the amount by which the position of the container 60 needs to be adjusted along the rotational direction A3, when performing the adjusting control.

As shown in FIG. 2-FIG. 4, the position detectors 30 include first sensors 31, second sensors 32, and third sensors 33 in the present embodiment. In the next few lines, descriptions are given for a first sensor 31, a second sensor 32, and a third sensor 33 that are provided for any one given holding location to detect the relative position (described below) of any loadable object 70 being transferred to that holding location. The same description applies to those sensors 31-33 provided for any other holding location. With first detecting direction D1 and second detecting direction D2 being defined to be two directions that are parallel to the reference plane (the horizontal plane in the present example) and are perpendicular to each other, the first sensor 31 is configured to detect the relative position of a loadable object 70 along the first detecting direction D1 with respect to the container 60. The second sensor 32 is provided at a location spaced apart from the first sensor 31 along the second detecting direction D2 and is configured to detect the relative position of the loadable object 70 along the first detecting direction D1 with respect to the container 60, from the location spaced apart from the first sensor 31 along the second detecting direction D2. And the third sensor 33 is configured to detect the relative position of the loadable object 70 along the second detecting direction D2 with respect to the container 60. In the present example, distance sensors (optical distance sensors, among other possibilities) are used as the first sensor 31, the second sensor 32, and the third sensor 33. Here, an optical distance sensor is a sensor which detects the distance to a target object based on the reflected light of the light irradiated toward the target object (loadable object 70 in the present example).

As shown in FIGS. 2-5, in the present embodiment, the first sensor 31 is supported by the first sensor support portion 41 fixed to the container holder 13; the second sensor 32 is supported by the second sensor support portion 42 fixed to the container holder 13; and the third sensor 33 is supported by the third sensor support portion 43 fixed to the container holder 13. Because the first sensor 31, the second sensor 32, and the third sensor 33 are provided and located as described above, the first detecting direction D1 and the second detecting direction D2 change depending on the rotational position of the rotatable platform 12 with the angle between the first detecting direction D1 and the second detecting direction D2 in a plane parallel to the reference plane (the horizontal plane in the present example) maintained constant (at 90 degrees in the present embodiment). In the present example, the same number of each of first sensors 31, second sensors 32, and third sensors 33 as the number of pairs of support portions 63 (with the pairs arranged one space apart from another) are supported by respective sensor support portions (41, 42, 43) such that a first sensor 31, a second sensor 32, and a third sensor 33 are located at a set height (described above) that corresponds to each of the pairs of support portions 63 (of holding locations) with the pairs arranged one spaced apart from another along the vertical direction Z.

In the present embodiment, as shown in FIGS. 4 and 5, the first detecting direction D1 coincides with the third direction X2. Therefore, each of the first sensor 31 and the second sensor 32 is configured to detect the relative position of a loadable object 70 (see FIGS. 2 and 3) along the third direction X2 with respect to the container 60 when the loadable object 70 is held by the transfer mechanism 53 and is in the holding space 62. In addition, in the present embodiment, the second detecting direction D2 coincides with the fourth direction Y2. Therefore, the third sensor 33 is configured to detect the relative position of a loadable object 70 (see FIGS. 2 and 3) along the fourth direction Y2 with respect to the container 60 when the loadable object 70 is held by the transfer mechanism 53 and is in the holding space 62.

And the controller 2 is configured to derive, based on detected information from each of the first sensor 31, the second sensor 32, and the third sensor 33: (a) the amount by which the position of the container 60 needs to be adjusted along the first adjusting direction A1; (b) the amount by which the position of the container 60 needs to be adjusted along the second adjusting direction A2; and (c) the amount by which the position of the container 60 needs to be adjusted along the rotational direction A3. In the present embodiment, as shown in FIG. 4, each first sensor 31 is configured to detect a first distance L1 which is the distance, along the third direction X2 (first detecting direction D1), to a side surface of the loadable object 70 that is held by the transfer mechanism 53 and is in the holding space 62. The corresponding second sensor 32 is configured to detect a second distance L2 which is the distance, along the third direction X2 (first detecting direction D1), to the side surface of the loadable object 70, as measured from a location spaced apart from the first sensor 31 along the fourth direction Y2 (second detecting direction D2). And the corresponding third sensor 33 is configured to detect a third distance L3 which is the distance, along the fourth direction Y2 (second detecting direction D2), to a side surface of the loadable object 70.

And, the controller 2 derives, based on the first distance L1, the second distance L2, and the third distance L3: (a) the amount by which the position of the container 60 needs to be adjusted along the first adjusting direction A1; (b) the amount by which the position of the container 60 needs to be adjusted along the second adjusting direction A2; and (c) the amount by which the position of the container 60 needs to be adjusted along the rotational direction A3. Without going into detail, the controller 2 is configured to derive, for each adjusting direction, the amount by which the position of the container 60 needs to be adjusted along the adjusting direction by performing, for example, geometric calculations. In the present embodiment, the controller 2 is configured to perform the adjusting control (in which the position of the container 60 is adjusted to place the loadable object in the proper position) when the loadable object 70 is located higher than the restricting portions 64 (that are provided to the pair of support portions 63 to which the loadable object 70 is transferred). And, in the present embodiment, the proper position is such a position of the container that the loadable object 70 does not overlap with any of the restricting portions 64 in plan view (as seen along a vertical direction, i.e., in a top down view), as shown in FIG. 5.

Next, the steps taken by the controller 2 to load a loadable object 70 into a container 60 (loading operation) are described with reference to FIG. 7. In addition, this loading operation is started with the transfer mechanism 53 (that is supporting the loadable object 70 by means of the support member 54 in the retracted position) located at its transfer location P, with the container adjusting unit 10 (holding the container 60 by means of the container holder 13) located at its transfer location P, and with the container holder 13 so positioned to be in the reference state described above.

As shown in FIGS. 2-4, with the support member 54 located at a set height that corresponds to the transfer target support portions 63, the controller 2 first causes the support member 54 to be projected by a set amount to cause the support member 54 and the loadable object 70 supported by the support member 54 to be moved into the holding space 62 of the container 60 (Step #01). And the controller 2 detects the relative position of the loadable object 70 (which is held by the transfer mechanism 53 and is in the holding space 62) with respect to the container 60 by using the position detectors 30 (Step #02), The controller 2 determines, based on the detection result, if the adjusting control needs to be performed (Step #03). In the present embodiment, the controller 2 determines that no adjusting control needs to be performed (Step #03: No) if it determines, based on the detection result by the position detectors 30, that the loadable object 70 is so positioned that it does not overlap with any of the restricting portions 64 in plan view. If that is the case, the controller 2 causes the support member 54 to approach the pair of support portions 63 from above to transfer the loadable object 70 supported by the support member 54 to the pair of support portions 63 (Step #05).

On the other hand, the controller 2 determines that adjusting control needs to be performed (Step #03: Yes) if it determines, based on the detection result by the position detectors 30, that the loadable object 70 is so positioned to overlap with any of the restricting portions 64 in plan view. If that is the case, the controller 2 performs the adjusting control (Step #04). In this adjusting control, as described above, for each of the first adjusting direction A1, the second adjusting direction A2, and the rotational direction A3, the amount by which the position of the container 60 needs to be adjusted along the adjusting direction is derived based on detected information from each of the position detectors 30. In the present example, derived for each adjusting direction A1, A2, A3 is the amount by which the position of the container 60 needs to be adjusted along the adjusting direction to position the loadable object 70 with respect to the container 60 such that the loadable object 70 does not overlap with any of the restricting portions 64 provided to the transfer target support portions 63 in plan view, as shown in FIG. 5. And the controller 2 controls the operations of the adjusting mechanisms 20 (the first adjusting mechanism 21, the second adjusting mechanism 22, and the third adjusting mechanism 23 in the present example) to adjust the position of the container 60 along the first adjusting direction A1 by the amount derived therefor, along the second adjusting direction A2 by the amount derived therefor, and along the rotational direction A3 by the amount derived therefor. And when the adjusting control is completed and the loadable object 70 is so positioned with respect to the container 60 that it does not overlap with the restricting portions 64 n plan view, as shown in FIG. 5, the controller 2 causes the support member 54 to approach the support portion 63 from above to cause the loadable object 70 supported by the support member 54 to be transferred to the pair of support portions 63 (Step #05).

When another loadable object 70 needs to be loaded into the container 60, the controller 2 controls the operations of the adjusting mechanisms 20 to return the container holder 13 to the reference state and performs the loading operation from Step #01 again.

Other Embodiments

Other embodiments of of the loading system are described next.

(1) In the embodiment described above, an example is described in which, for each pair of support portions 63 (or holding location), the position detectors 30 include three sensors, namely, the first sensor 31, the second sensor 32, and the third sensor 33, and in which the controller 2 is configured to derive, based on detected information from each of the first sensor 31, the second sensor 32, and the third sensor 33: (a) the amount by which the position of the container 60 needs to be adjusted along; (b) the amount by which the position of the container 60 needs to be adjusted along the second adjusting direction A2; and (c) the amount by which the position of the container 60 needs to be adjusted along the rotational direction A3. However, the invention is not limited to such an arrangement. For each pair of support portions 63, the position detectors 30 may include four or more sensors, and the controller 2 may be configured to derive, based on detected information from each of the plurality of sensors that the position detectors 30 include: (a) the amount by which the position of the container 60 needs to be adjusted along the first adjusting direction A1; (b) the amount by which the position of the container 60 needs to be adjusted along the second adjusting direction A2; and (c) the amount by which the position of the container 60 needs to be adjusted along the rotational direction A3. For example, in addition to the three sensors, namely the first sensor 31, the second sensor 32, and the third sensor 33, the position detectors 30 may include a fourth sensor provided at a location spaced apart from the third sensor 33 along the first detecting direction D1 (the third direction X2 in the embodiment described above) and is configured to detect the relative position of the loadable object 70 along the second detecting direction D2 (the fourth direction Y2 in the embodiment described above) with respect to the container 60 from a location spaced apart from the third sensor 33 along the first detecting direction D1.

(2) In the embodiment described above, an example is described in which the first sensors 31, the second sensors 32, and the third sensors 33 are fixed (indirectly) to the container holder 13 so that the first detecting direction D1 and the second detecting direction D2 change depending on the rotational position of the rotatable platform 12. However, the invention is not limited to such an arrangement. The first sensors 31, the second sensors 32, and the third sensors 33 may be fixed to the main body 11 so that the first detecting direction D1 and the second detecting direction D2 do not depend on the rotational position of the rotatable platform 12. In this case, for example, the first detecting direction D1 may be defined to coincide with the first direction X1 whereas the second detecting direction D2 may be defined to coincide with the second direction Y1.

(3) In the embodiment described above, an example is described in which, the controller 2 is configured to derive, based on the first distance L1, the second distance L2, and the third distance L3: (a) the amount by which the position of the container 60 needs to be adjusted along the first adjusting direction A1; (b) the amount by which the position of the container 60 needs to be adjusted along the second adjusting direction A2; and (c) the amount by which the position of the container 60 needs to be adjusted along the rotational direction A3. However, the invention is not limited to such an arrangement. For example, the position detectors 30 may include one or more image sensors. And the controller 2 may derive, based on result of image processing performed on the detected information from the one or more image sensors: (a) the amount by which the position of the container 60 needs to be adjusted along the first adjusting direction A1; (b) the amount by which the position of the container 60 needs to be adjusted along the second adjusting direction A2; and (c) the amount by which the position of the container 60 needs to be adjusted along the rotational direction A3.

(4) In the embodiment described above, an example is described in which the mechanism that moves the entire container adjusting unit 10 along the second direction Y1 is used as the second adjusting mechanism 22. However, the invention is not limited to such an arrangement. A second adjusting mechanism 22 may be provided in addition to the mechanism that moves the entire container adjusting unit 10 along the second direction Y1. For example, such second adjusting mechanism 22 may be a mechanism that adjusts the location of the container holder 13 along the second adjusting direction A2 with respect to the rotatable platform 12. In this case, the second adjusting direction A2 coincides with the fourth direction Y2, for example. Also, the second adjusting mechanism 22 may be a mechanism that adjusts the location of the rotatable platform 12 along the second adjusting direction A2 with respect to the main body 11. In this case, the second adjusting direction A2 coincides with the second direction Y1, for example. In the case where the second adjusting mechanism 22 is provided in addition to the mechanism that moves the entire container adjusting unit 10 along the second direction Y1, arrangement may be made so that the entire container adjusting unit 10 is moved along the first direction X1 and the mechanism that moves the entire container adjusting unit 10 along the first direction X1 may be used as the first adjusting mechanism 21. In this case, the first adjusting direction A1 coincides with the first direction X1.

(5) In the embodiment described above, an example is described in which the first adjusting mechanism 21 is the mechanism that adjusts the position of the container holder 13 along the first adjusting direction A1 with respect to the rotatable platform 12. However, the invention is not limited to such an arrangement. the first adjusting mechanism 21 may be a mechanism that adjusts the position of the rotatable platform 12 along the first adjusting direction A1 with respect to the main body 11. In this case, the first adjusting direction A1 may coincide with the first direction X1, for example.

(6) In the embodiment described above, an example is described in which the container adjusting unit 10, with a container 60 held thereby, is capable of moving by an amount that exceeds the amount of adjustment required by the adjusting control. However, the invention is not limited to such an arrangement. The arrangement may be such that the container adjusting unit 10 may remain in its transfer location P and the container adjusting unit 10 does not move by an amount that exceeds the amount of adjustment required by the adjusting control.

(7) In the embodiment described above, an example is described in which the transport device 50 including the transfer mechanism 53 is a stacker crane. However, the invention is not limited to such an arrangement. The transport device 50 may be a transport device other than a stacker crane and may be, among other possibilities, a transport device that autonomously travels on the floor while keeping track of its own current position, or a ceiling or overhead transport vehicle that travels while being supported by one or more rails supported by the ceiling and being guided by the one or more rails. Also, in the embodiment described above, an example is described in which the transport device 50 is provided to the transfer mechanism 53; however, the transfer mechanism 53 may be so arranged that it is fixed at, and unable to move from, its transfer location P.

(8) In the embodiment described above, an example is described in which the transfer mechanism 53 has the support member 54 which supports a loadable object 70 from below. However, the invention is not limited to such an arrangement. The transfer mechanism 53 may have, among other possibilities, a support member that supports a loadable object 70 from above (by means of a suction device, for example), or support members (clamp members) which grips or holds a loadable object 70 from two horizontal sides.

(9) In the embodiment described above, an example is described in which each loadable object 70 is a mask. However, the invention is not limited to such an arrangement. However, loadable objects 70 may be other objects (other than masks) that are flat and thin (for example, glass substrates, semiconductor wafers, reticles, etc.). In addition, a loadable object 70 may be an object that is not flat and thin (for example, an object that has a box shape or is cylindrical, etc.).

(10) Note that an arrangement disclosed in any of the embodiments described above can also be used in combination with any arrangement disclosed in any other embodiment unless inconsistency arises. This applies to any combination of embodiments which are described as "other embodiments". Regarding any arrangements and features, the embodiments disclosed in the present description are provided for the purposes of illustration only regarding all aspects. Therefore, it is possible to make various suitable changes without departing from the spirit of the present disclosure.

Summary of Embodiments Described Above

A brief summary of the loading system described above is provided next.

A loading system disclosed is one configured to load a loadable object into a container and comprises: a container holder configured to hold a container; one or more adjusting mechanisms configured to adjust a position of the container held by the container holder; a controller configured to control operation of the one or more adjusting mechanisms; a transfer mechanism configured to move a loadable object into a holding space of the container with the container held by the container holder to transfer the loadable object to the container; one or more position detectors configured to detect a position of a loadable object; wherein the one or more position detectors are so located to detect a relative position of a loadable object with respect to the container when the loadable object is held by the transfer mechanism and is in the holding space, and wherein the controller is configured to perform an adjusting control in which the position of the container is adjusted to place the container in a proper position with respect to the loadable object, the adjusting control being performed based on detected information from the one or more position detectors, and being performed during at least a portion of a process of transferring the loadable object by the transfer mechanism, and being completed before the loadable object becomes supported by the container.

With such an arrangement, because the adjusting control is performed during at least a portion of a process of transferring a loadable object to a container by the transfer mechanism, the loadable object can be placed in a proper holding position in the container by adjusting the position of the container held by the container holder such that the container is in the proper position with respect to the loadable object, when transferring the loadable object to the container. In addition, this adjusting control is completed before the loadable object becomes supported by the container; therefore, the position of the container can be adjusted smoothly while the loadable object and the container are not in contact with each other.

Thus, with the arrangement described above, by performing the adjusting control during at least a portion of a process of transferring a loadable object to the container by the transfer mechanism, the loadable object can be placed in a proper holding position in the container, when transferring the loadable object to a container. Thus, the loadable object can be placed in the proper holding position in the container without the need to perform an operation to move the loadable object other than the transferring of the loadable object to the container. Thus, the number of steps required to achieve such a state can be reduced.

Note that, with the arrangement described above, the relative position of one of the loadable object held by the transfer mechanism and the container held by the container holder with respect to the other is adjusted by adjusting the position of the container held by the container holder. Thus, this loading system can be advantageously used in a case where it is difficult to finely adjust the position of a loadable object with the transfer mechanism.

Here, each loadable object is preferably formed to be flat and thin, wherein the container is preferably so configured to hold one or more loadable objects such that each loadable object is parallel to a reference plane, and wherein, with a first adjustment direction and a second adjustment direction being two directions that are parallel to the reference plane and perpendicular to each other, the one or more adjusting mechanisms are preferably capable of adjusting the position of the container along each of the first adjusting direction, the second adjusting direction, and a rotational direction about an axis extending perpendicular to the reference plane.

With such an arrangement, the position of the container can be adjusted by the one or more adjusting mechanisms so as to place the container in the proper position with respect to the loadable object, not only in a case where the position of the loadable object held by the transfer mechanism is displaced in one or more directions that are parallel to the reference plane with respect to the proper orientation for the container, but also in a case where the orientation of the loadable object held by the transfer mechanism (i.e., the orientation as seen along a direction perpendicular to the reference plane) is tilted with respect to the proper orientation for the container. Therefore, it is made easier for a loadable object to be placed in the proper holding position in a container regardless of the orientation of the loadable object held by the transfer mechanism.

In an arrangement in which the one or more adjusting mechanisms are capable of adjusting the position of the container along each of the first adjusting direction, the second adjusting direction, and a rotational direction, and with a first detecting direction and a second detecting direction being two directions that are parallel to the reference plane and perpendicular to each other, the one or more position detectors preferably include: a first sensor configured to detect the relative position of a loadable object along the first detecting direction with respect to the container; a second sensor configured to detect the relative position of the loadable object along the first detecting direction with respect to the container, from a location spaced apart from the first sensor along the second detecting direction; and a third sensor configured to detect the relative position of the loadable object along the second detecting direction with respect to the container, and wherein, the controller is preferably configured to derive, based on detected information from each of the first sensor, the second sensor, and the third sensor: (a) an amount by which the position of the container needs to be adjusted along the first adjusting direction; (b) an amount by which the position of the container needs to be adjusted along the second adjusting direction; and (c) an amount by which the position of the container needs to be adjusted along the rotational direction.

With such an arrangement, the position of the container can be adjusted to place the container in the proper position with respect to the loadable object by deriving the amount by which the position of the container needs to be adjusted along the first adjusting direction, the amount by which the position of the container needs to be adjusted along the second adjusting direction, and the amount by which the position of the container needs to be adjusted along the rotational direction, without having to make it necessary to make more complex the relatively simple constructions of the one or more position detectors.

In the loading system as described above, the container preferably has one or more support portions with each support portion configured to support a loadable object from below, wherein the transfer mechanism is preferably configured to transfer a loadable object to a support portion from above, wherein each support portion preferably has one or more restricting portions configured to restrict horizontal movement of a loadable object with each restricting portion located to a side of the loadable object that is at least partially supported by the support portion, wherein the proper position is preferably such a position of the container that the loadable object does not overlap with any of the one or more restricting portions as seen along a vertical direction, and wherein the controller is preferably configured to perform the adjusting control when the loadable object is located higher than the one or more restricting portions.

With such an arrangement, because each support portion has one or more restricting portions, the position of a loadable object held in the container can be held to a proper holding position in the container by the restricting portion(s). And, with the arrangement described above, the adjusting control is performed when the loadable object is located higher than the one or more restricting portions. And in this adjusting control, the position of the container is adjusted such that the loadable object does not overlap with any of the restricting portions as seen along a vertical direction. Therefore, even when each support portion has one or more restricting portions, a loadable object can be transferred to a support portion of the container without the loadable object coming into contact with the restricting portion(s).

It is considered to be sufficient for the loading system in accordance with the present disclosure to perform at least one of the results or effects described above.

What is claimed is:

1. A loading system configured to load a loadable object into a container, comprising:
   a container holder configured to hold a container;
   one or more adjusting mechanisms configured to adjust a position of the container held by the container holder;
   a controller configured to control operation of the one or more adjusting mechanisms;
   a transfer mechanism configured to move a loadable object into a holding space of the container with the container held by the container holder to transfer the loadable object to the container; and
   one or more position detectors configured to detect a position of a loadable object,
   wherein the one or more position detectors are so located to detect a relative position of a loadable object with respect to the container when the loadable object is held by the transfer mechanism and is in the holding space,
   wherein the controller is configured to perform an adjusting control in which the position of the container is adjusted to place the container in a proper position with respect to the loadable object, the adjusting control being performed based on detected information from the one or more position detectors, and being performed during at least a portion of a process of transferring the loadable object by the transfer mechanism, and being completed before the loadable object becomes supported by the container,
   wherein the container has one or more support portions with each support portion configured to support a loadable object from below,
   wherein the transfer mechanism is configured to transfer a loadable object to a support portion from above,
   wherein each support portion has one or more restricting portions configured to restrict horizontal movement of a loadable object with each restricting portion located to a side of the loadable object that is at least partially supported by the support portion,
   wherein the proper position is such a position of the container that the loadable object does not overlap with any of the one or more restricting portions as seen along a vertical direction, and
   wherein the controller is configured to perform the adjusting control when the loadable object is located higher than the one or more restricting portions.

2. A loading system configured to load a loadable object into a container, comprising:
   a container holder configured to hold a container;
   one or more adjusting mechanisms configured to adjust a position of the container held by the container holder;
   a controller configured to control operation of the one or more adjusting mechanisms;
   a transfer mechanism configured to move a loadable object into a holding space of the container with the container held by the container holder to transfer the loadable object to the container; and
   one or more position detectors configured to detect a position of a loadable object,
   wherein the one or more position detectors are so located to detect a relative position of a loadable object with respect to the container when the loadable object is held by the transfer mechanism and is in the holding space,
   wherein the controller is configured to perform an adjusting control in which the position of the container is adjusted to place the container in a proper position with respect to the loadable object, the adjusting control being performed based on detected information from the one or more position detectors, and being performed during at least a portion of a process of transferring the loadable object by the transfer mechanism, and being completed before the loadable object becomes supported by the container,
   wherein each loadable object is formed to be flat and thin,
   wherein the container is so configured to hold one or more loadable objects such that each loadable object is parallel to a reference plane,
   wherein, with a first adjustment direction and a second adjustment direction being two directions that are parallel to the reference plane and perpendicular to each other, the one or more adjusting mechanisms are capable of adjusting the position of the container along each of the first adjusting direction, the second adjusting direction, and a rotational direction about an axis extending perpendicular to the reference plane,
   wherein with a first detecting direction and a second detecting direction being two directions that are parallel to the reference plane and perpendicular to each other, the one or more position detectors include: a first sensor configured to detect the relative position of a loadable object along the first detecting direction with respect to the container; a second sensor configured to detect the relative position of the loadable object along the first detecting direction with respect to the container, from a location spaced apart from the first sensor along the second detecting direction; and a third sensor configured to detect the relative position of the loadable object along the second detecting direction with respect to the container, and
   wherein, the controller is configured to derive, based on detected information from each of the first sensor, the second sensor, and the third sensor: (a) an amount by which the position of the container needs to be adjusted along the first adjusting direction; (b) an amount by which the position of the container needs to be adjusted along the second adjusting direction; and (c) an amount by which the position of the container needs to be adjusted along the rotational direction.

* * * * *